(12) United States Patent
Sheraw et al.

(10) Patent No.: US 7,491,598 B2
(45) Date of Patent: Feb. 17, 2009

(54) CMOS CIRCUITS INCLUDING A PASSIVE ELEMENT HAVING A LOW END RESISTANCE

(75) Inventors: Christopher D. Sheraw, Wappingers Falls, NY (US); Alyssa C. Bonnoit, Beacon, NY (US); K. Paul Muller, Wappingers Falls, NY (US); Werner Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/956,993

(22) Filed: Dec. 14, 2007

(65) Prior Publication Data

US 2008/0096342 A1    Apr. 24, 2008

Related U.S. Application Data

(62) Division of application No. 11/164,515, filed on Nov. 28, 2005, now Pat. No. 7,361,959.

(51) Int. Cl.
*H01L 21/8238* (2006.01)

(52) U.S. Cl. .................. 438/210; 438/199; 438/200

(58) Field of Classification Search ............... 438/199, 438/200, 207, 210, 300; 257/E27.016, E27.047, 257/E27.071

See application file for complete search history.

(56) References Cited

U.S. PATENT DOCUMENTS

| 5,939,753 | A  |   | 8/1999  | Ma et al. |
|-----------|----|---|---------|-----------|
| 6,166,416 | A  | * | 12/2000 | Kim ............................ 257/379 |
| 6,225,658 | B1 |   | 5/2001  | Watanabe |
| 6,462,386 | B2 |   | 10/2002 | Moriwaki et al. |
| 6,707,116 | B2 | * | 3/2004  | Ohkubo et al. ............. 257/379 |

* cited by examiner

*Primary Examiner*—Hung Vu
(74) *Attorney, Agent, or Firm*—Scully, Scott, Murphy & Presser, P.C.; H. Daniel Schnurmann

(57) ABSTRACT

The present invention relates to complementary metal-oxide-semiconductor (CMOS) circuits, as well as methods for forming such CMOS circuits. More specifically, the present invention relates to CMOS circuits that contain passive elements, such as buried resistors, capacitors, diodes, inductors, attenuators, power dividers, and antennas, etc., which are characterized by an end contact resistance of less than 90 ohm-microns. Such a low end resistance can be achieved either by reducing the spacer widths of the passive elements to a range of from about 10 nm to about 30 nm, or by masking the passive elements during a pre-amorphization implantation step, so that the passive elements are essentially free of pre-amorphization implants.

10 Claims, 10 Drawing Sheets

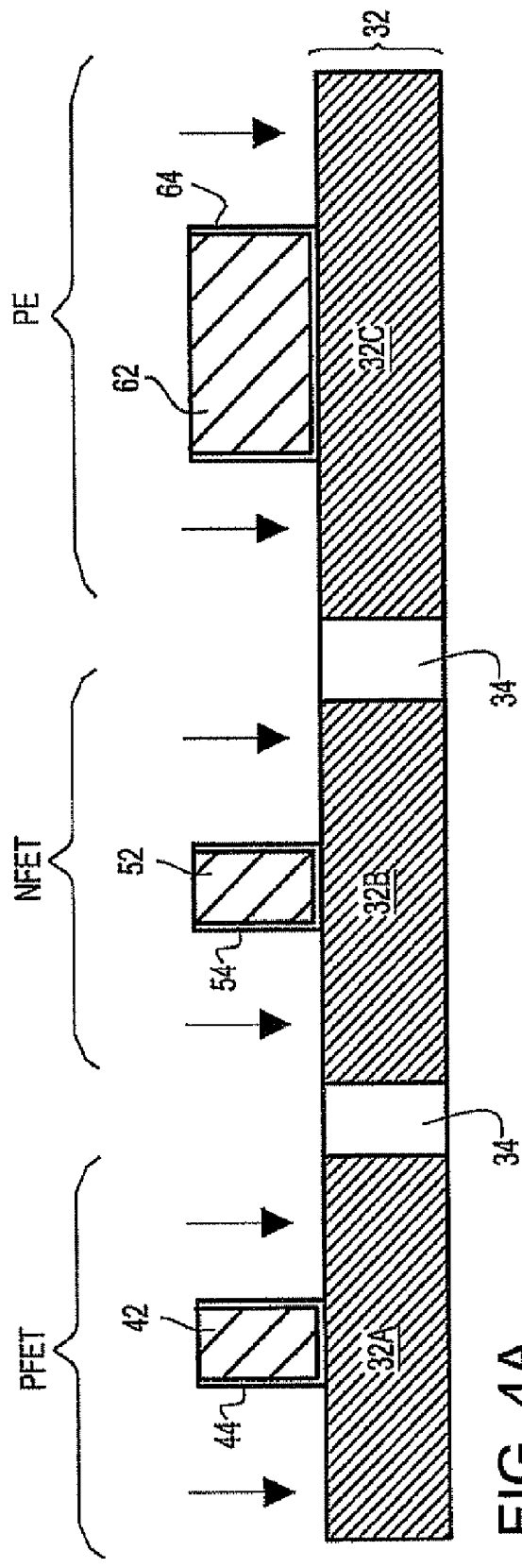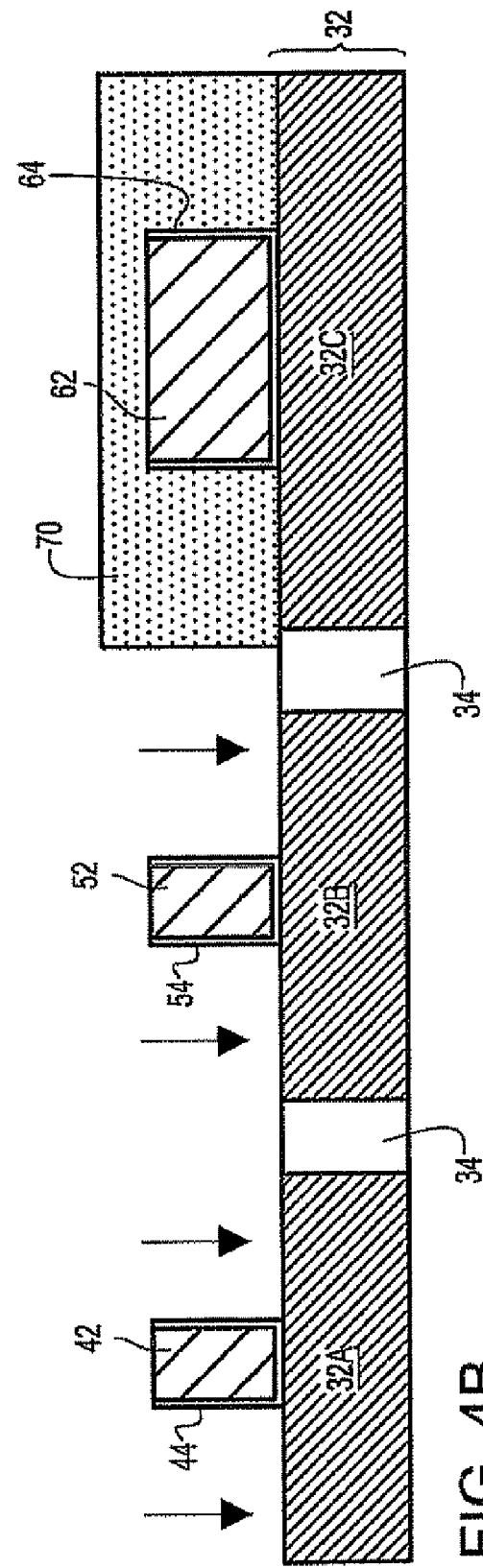
FIG. 4A (PRIOR ART)
FIG. 4B

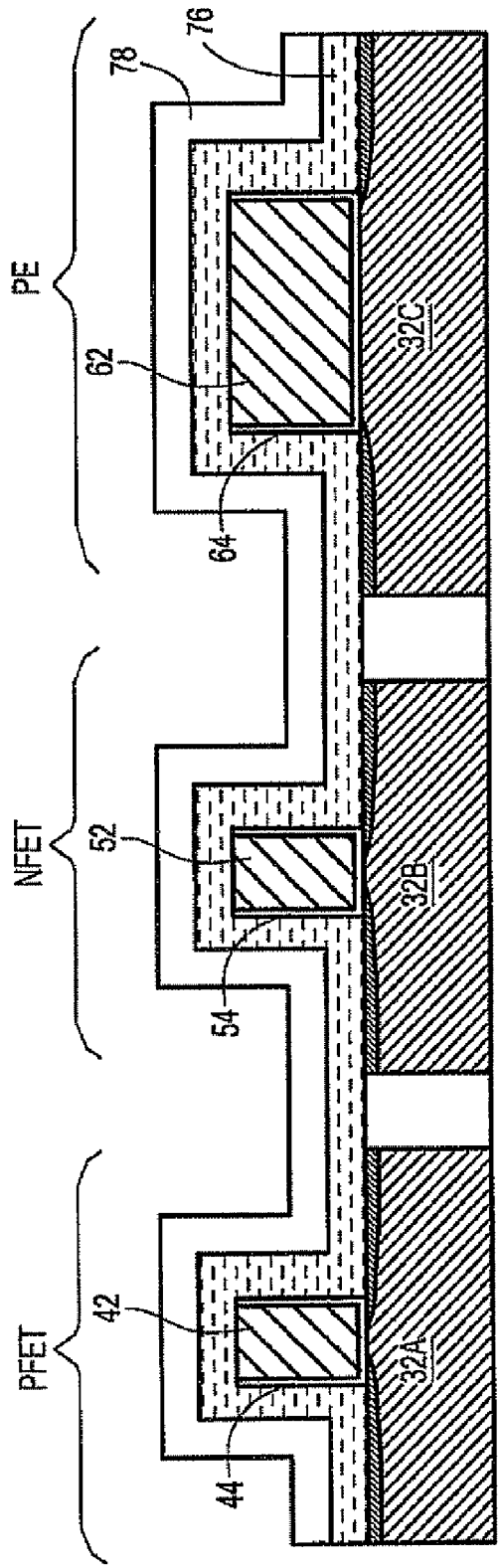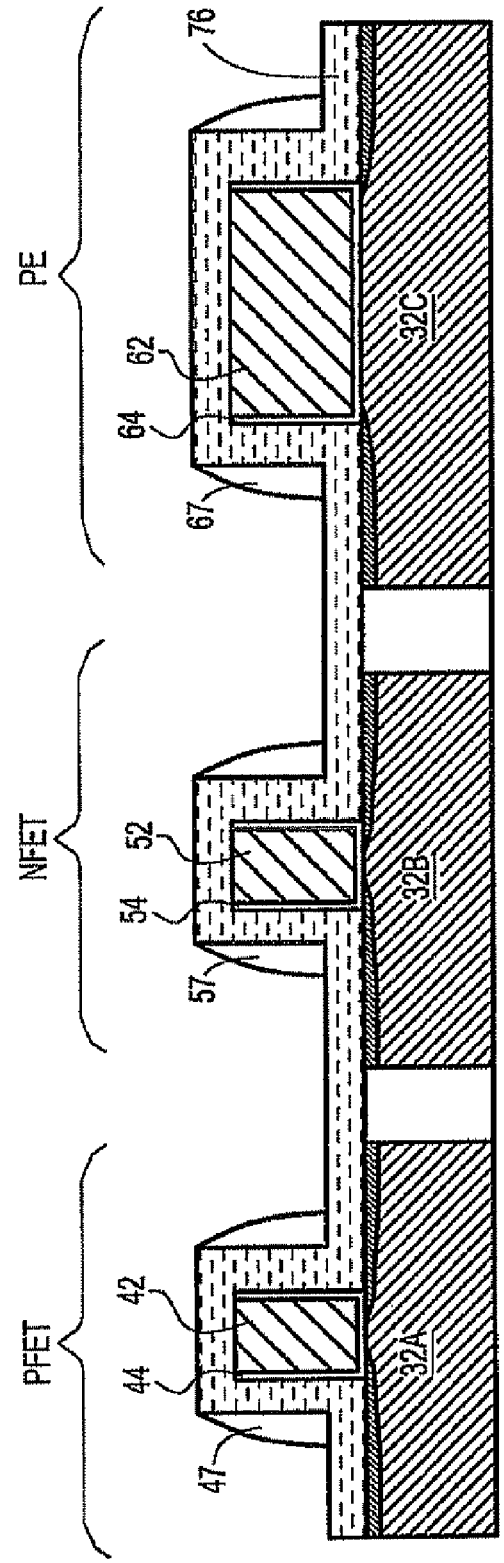

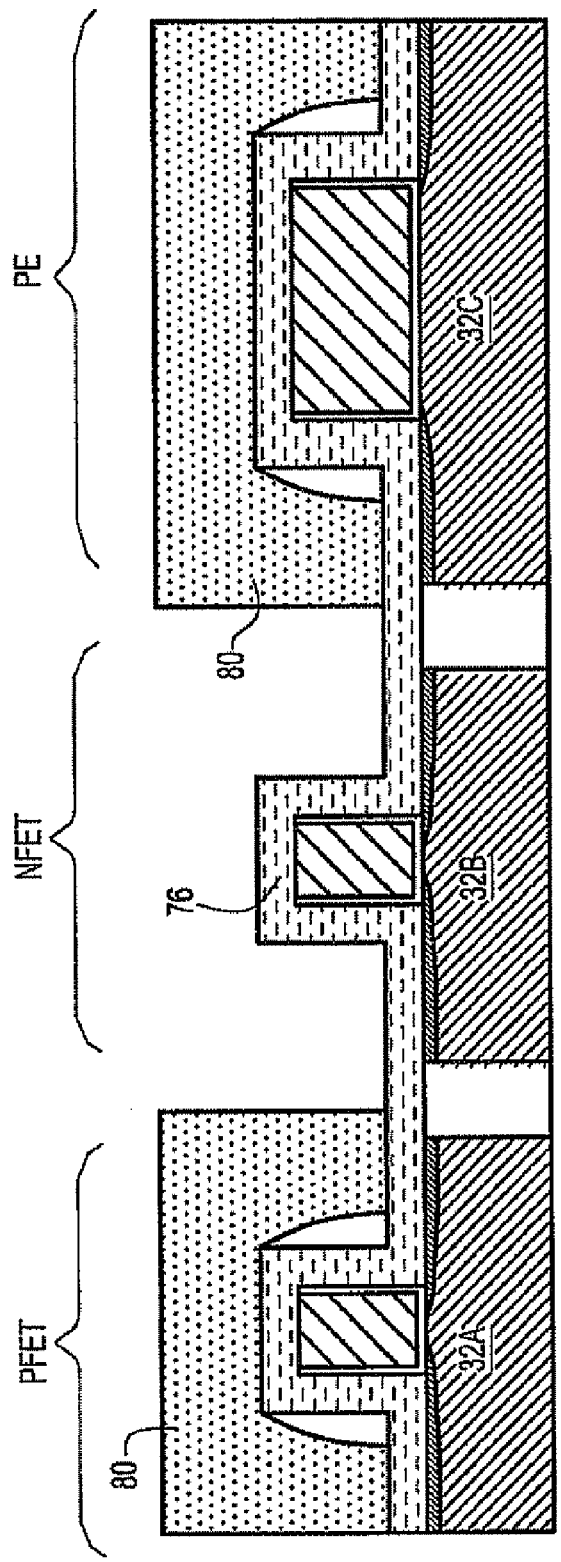
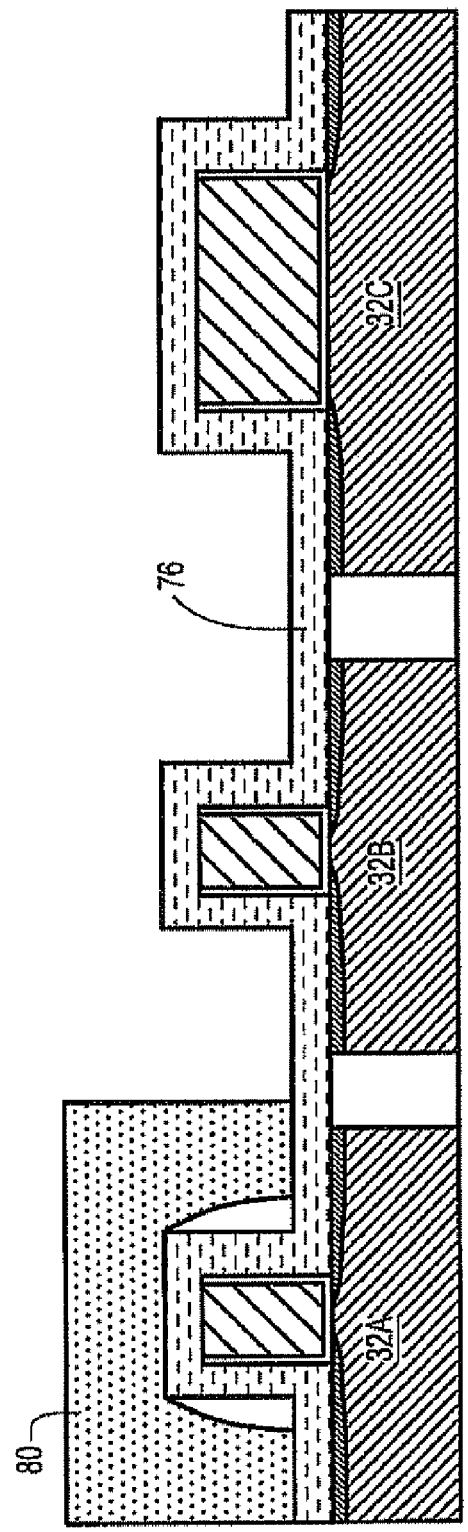

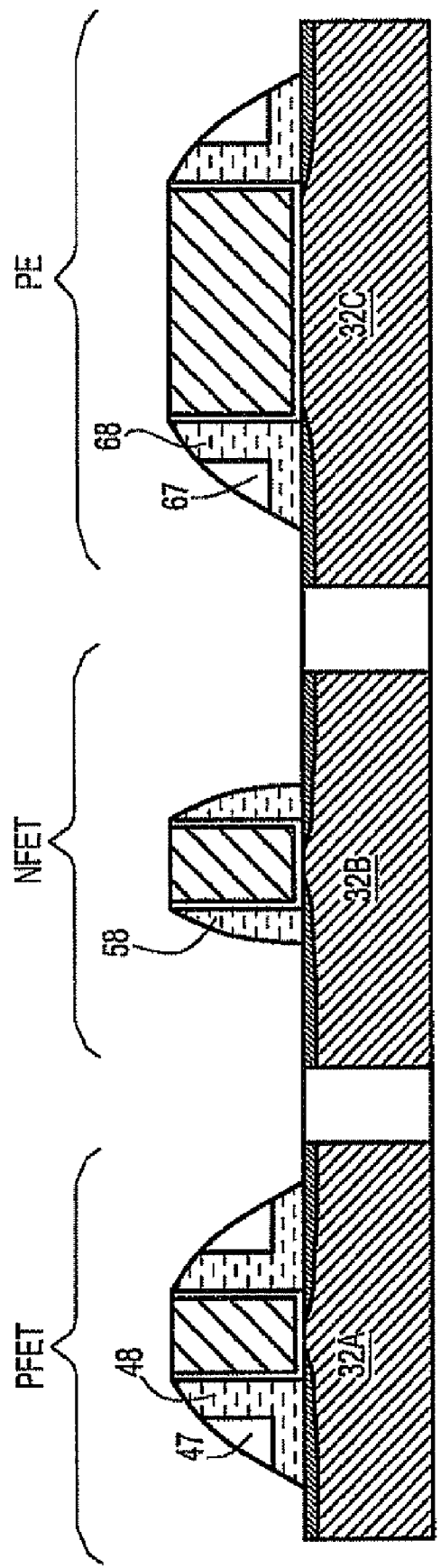
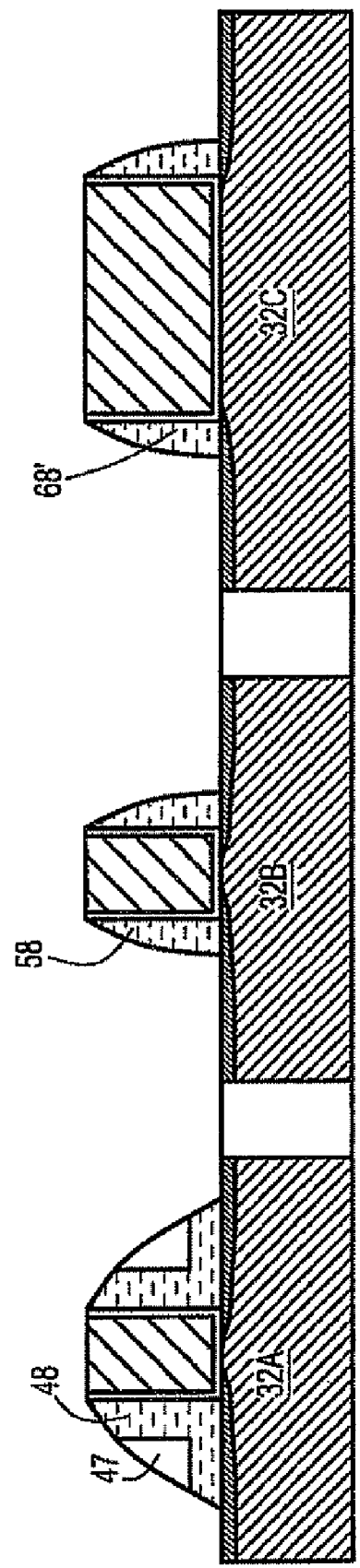

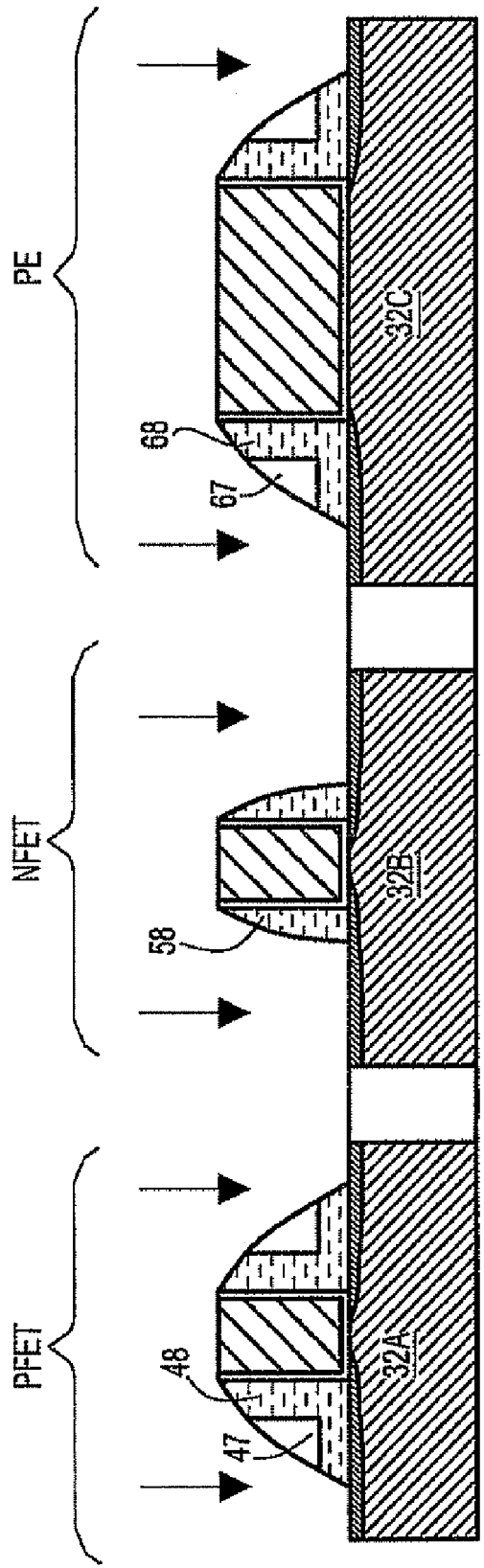
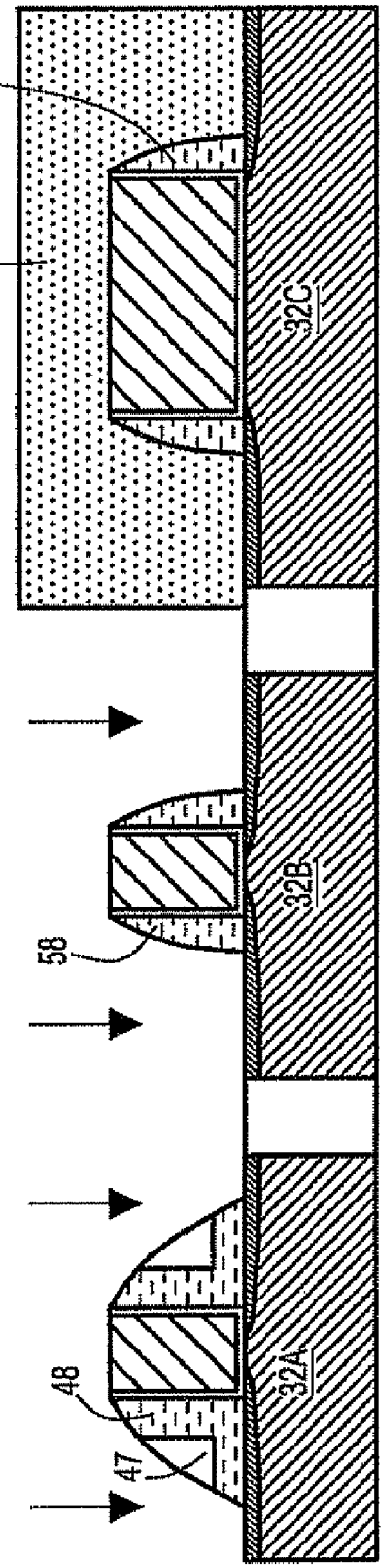
FIG. 11A (PRIOR ART)
FIG. 11B

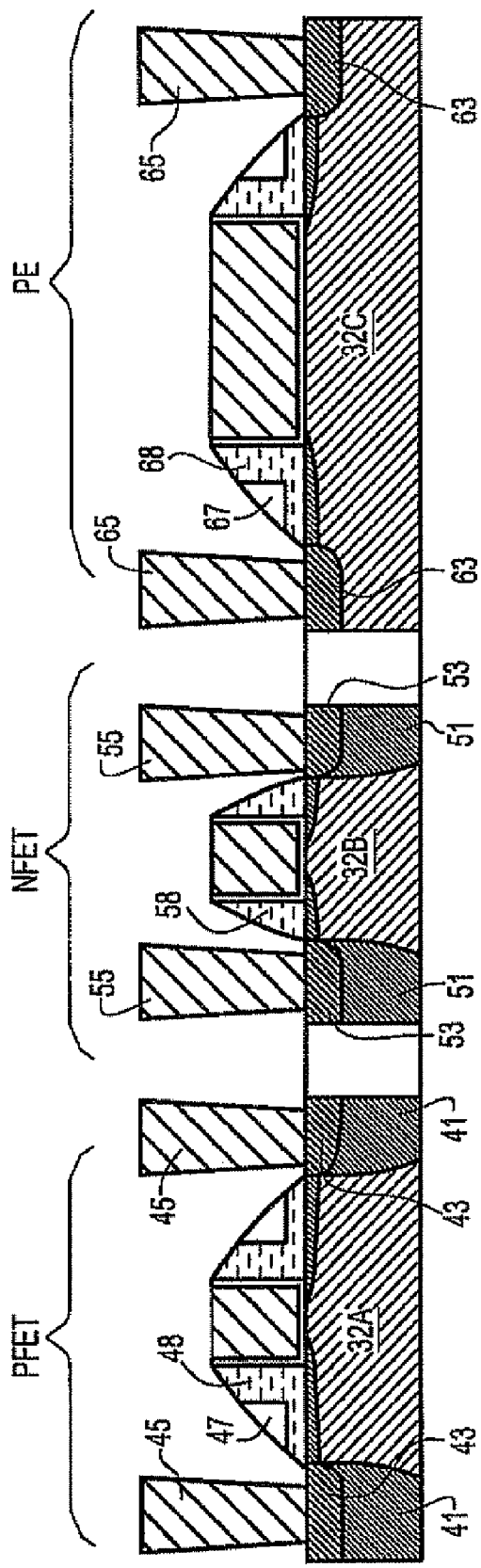
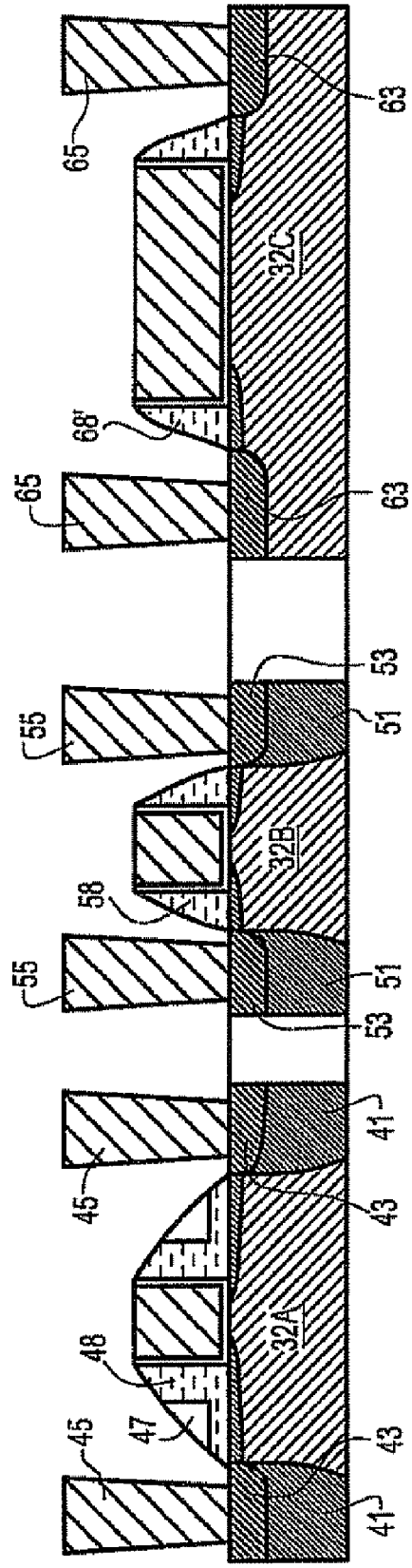
FIG. 12A (PRIOR ART)
FIG. 12B

US 7,491,598 B2

CMOS CIRCUITS INCLUDING A PASSIVE ELEMENT HAVING A LOW END RESISTANCE

RELATED APPLICATION

This application is a divisional of U.S. patent application Ser. No. 11/164,515, filed Nov. 28, 2005.

FIELD OF THE INVENTION

The present invention relates to complementary metal-oxide-semiconductor (CMOS) circuits, as well as methods for forming same. More specifically, the present invention relates to CMOS circuits that comprise passive elements of low contact resistance.

BACKGROUND OF THE INVENTION

Contact resistance in 90 nm CMOS technology and beyond has a significant impact on the device performance of small precision passive elements typically used for forming analog circuitry in CMOS circuits, which include, but are not limited to: buried resistors, capacitors, diodes, inductors, attenuators, power dividers, and antennas. Generally, higher contact resistance causes reduced device operation speed, increased device heating, and other undesirable consequences.

One approach to reduce the contact resistance is to increase the dopant concentration of the semiconductor device region to which the contact is to be made. The semiconductor device region, typically formed of a silicon or polysilicon layer, can be doped with impurities such as arsenic, phosphorus, boron, and the like. However, silicon or polysilicon has limited impurity solubility, and the ability to decrease contact resistance by increasing the dopant concentration is therefore limited, because it cannot proceed beyond the impurity solubility limits of the silicon or polysilicon. Further, high impurity concentration may adversely impact other device characteristics.

As the trend toward smaller device geometries proceeds, coupled with the desire for still further improved device performance, there is a continuing need for passive element structures and methods of forming same, which will allow further decreased contact resistance, especially for passive elements to be incorporated into 90 nm CMOS circuits.

SUMMARY OF THE INVENTION

The present invention, in one aspect, relates to a complementary metal-oxide-semiconductor (CMOS) circuit, comprising:
  a. at least one n-type field effect transistor (n-FET) located on a semiconductor substrate;
  b. at least one p-type field effect transistor (p-FET) located on the semiconductor substrate and adjacent to the at least one n-FET; and
  c. at least one passive element located on the semiconductor substrate and adjacent to the n-FET and p-FET, wherein the at least one passive element has an end resistance of less than 90 ohm-microns.

The term "end resistance" as used herein refers to the sum of the following resistance components: metal contact to silicide interfacial resistance, parasitic silicide resistance, silicide to silicon/polysilicon interfacial resistance, and the resistance due to current spreading.

In a specific embodiment of the present invention, the at least one passive element comprises one or more sidewall spacers and has a spacer width from about 10 nm to about 30 nm, which is similar to the spacer width of the at least one n-FET, but is significantly narrower than the spacer width of the at least one p-FET (which typically ranges from about 40 nm to about 80 nm).

In another specific embodiment of the present invention, the at least one passive element is essentially free of pre-amorphization implants (typically including, but not limited to: germanium, silicon or xenon), while the at least one p-FET and the at least one n-FET both comprises pre-amorphization implants at a dosage concentration from about $1\times10^{13}/cm^2$ to about $1\times10^{16}/cm^2$.

In a preferred, but not necessary, embodiment of the present invention, the at least one passive element has a spacer width from about 10 nm to about 30 nm and is also essentially free of pre-amorphization implants.

The at least one passive element in the present invention may be any suitable passive element commonly used for forming analog circuitry, which includes, but is not limited to: buried resistors, capacitors, diodes, inductors, attenuators, power dividers, antennas, etc. Preferably, the at least one passive element is a buried resistor with a silicon resistive element that is located within the semiconductor substrate and whose length is defined by a polysilicon gate stack located thereabove.

In another aspect, the present invention relates to a method for forming a CMOS circuit, comprising forming at least one n-type field effect transistor (n-FET), at least one p-type field effect transistor (p-FET), and at least one passive element on adjacent but isolated device regions on a semiconductor substrate, wherein the at least one passive element has an end resistance of less than 90 ohm-microns.

Preferably, the at least one passive element and the at least one n-FET each has one or more sidewall spacers with a spacer width from about 10 nm to about 30 nm, while the at least one p-FET has one or more sidewall spacers with a spacer width ranging from about 40 nm to about 80 nm. These sidewall spacers can be readily formed by the following processing steps:
  a. forming a first insulating layer over the at least one n-FET, the at least one p-FET, and the at least one passive element;
  b. forming a second insulating layer over the first insulating layer, wherein the first and second insulating layer comprises different insulator materials;
  c. patterning the second insulating layer to form outer sidewall spacers for the at least one n-FET, the at least one p-FET, and the at least one passive element;
  d. forming a patterned mask to selectively protect the at least one p-FET and to expose the at least one n-FET and the at least one passive element;
  e. selectively removing the outer sidewall spacers of the at least one n-FET and the at least one passive element, wherein the outer sidewall spacer of the at least one p-FET is protected by the patterned mask;
  f. removing the patterned mask;
  g. patterning the first insulating layer to form inner sidewall spacers for the at least one n-FET, the at least one p-FET, and the at least one passive element, wherein the at least one p-FET, being partially protected by the outer sidewall spacer, has an inner sidewall spacers with a spacer width ranging from about 40 nm to about 80 nm, and wherein the at least one n-FET and the at least one passive element, not protected by any outer sidewall spacer, each has an inner sidewall spacer with a spacer width ranging from about 10 nm to about 30 nm.

Preferably, at least one pre-amorphization implantation step is carried out using germanium, silicon, or xenon implants at a dosage concentration ranging from about $1\times10^{13}/cm^2$ to about $1\times10^{16}/cm^2$ for creating an amorphous region in the at least one n-FET and the at least one p-FET. During the pre-amorphization implantation, the at least one passive element is selectively protected by a patterned mask so that the passive element is essentially free of pre-amorphization implants.

Other aspects, features and advantages of the invention will be more fully apparent from the ensuing disclosure and appended claims.

BRIEF DESCRIPTION OF THE DRAWINGS

FIGS. 3-12 illustrates the processing steps for forming a CMOS circuit containing a buried resistor according to one embodiment of the present invention, in comparison with conventional processing steps for forming a CMOS circuit containing a conventional buried resistor.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on or over the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides low contact resistance passive elements, which are specifically characterized by an end resistance of less than 90 ohm-microns and which can be readily incorporated into the CMOS circuits with no or few additional processing steps.

The low contact resistance of the passive elements is achieved in the present invention by either forming sidewall spacers that are significantly narrower than those used in conventional passive elements, or by selectively blocking the passive elements from pre-amorphization implants.

Figure 1:
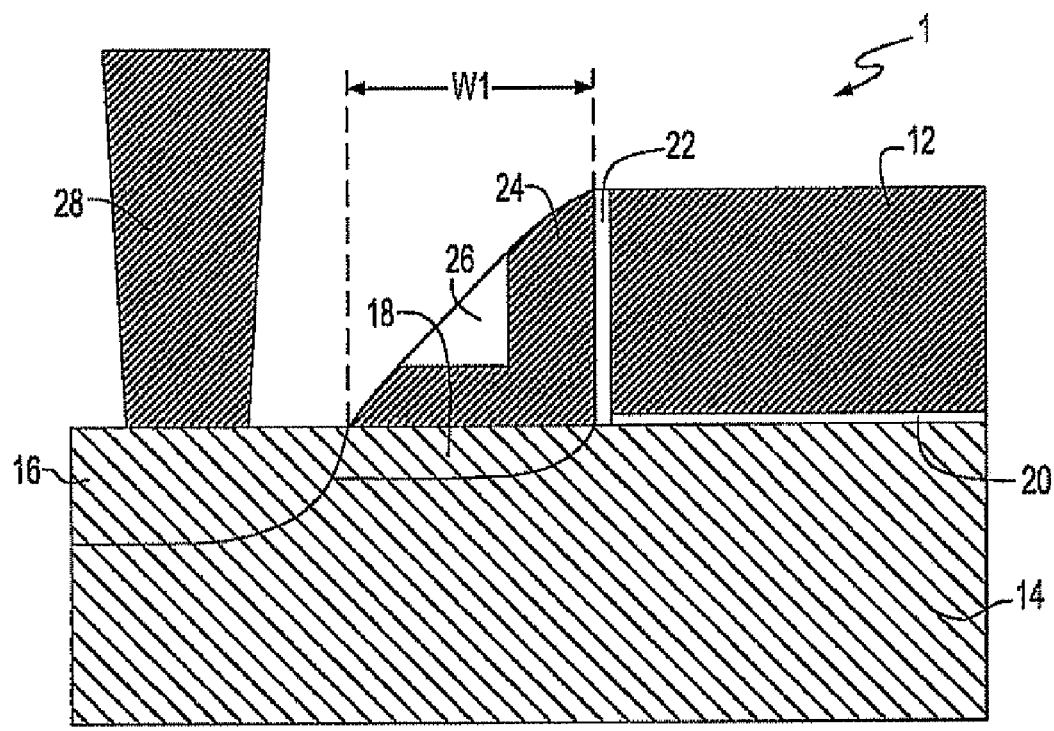
FIG. 1 shows a partial cross-sectional view of a conventional buried resistor containing both an outer oxide sidewall spacer and an inner nitride sidewall spacer and having a spacer width (W1) ranging from about 40 nm to about 80 nm.

FIG. 1 shows a partial cross-sectional view of a conventional buried resistor 1. Specifically, a polysilicon element 12 is located on a semiconductor substrate 14 between a first metal contact 28 and a second metal contact (not shown). The polysilicon element 12 is electrically isolated from the surrounding by a thin dielectric layer 20 and a thin offset spacer 22. The resistive element of the buried resistor 1 is located in the semiconductor substrate 14 and has a length determined by the size of the polysilicon element 12 thereabove. The thin dielectric layer 20 and the thin offset spacer 22 can comprise any suitable dielectric material, such as oxides, nitrides, and oxynitrides. Preferably, they both comprise silicon dioxide and both have a thickness from about 1 nm to about 20 nm.

An inner sidewall spacer 24 and an outer sidewall spacer 26 are provided along sidewalls of the polysilicon element 12. Preferably, the inner sidewall spacer 24 is formed of silicon nitride, while the outer sidewall spacer 26 is formed of silicon dioxide. The inner and outer sidewall spacers 24 and 26 define a spacer width (W1) ranging from about 40 nm to about 80 nm for the conventional buried resistor 1.

Further, an extension implant region 18 and a surface metal silicide layer 16 are provided in the semiconductor substrate 14 to reduce the contact resistance of the conventional buried resistor 1. Specifically, the extension implant region 18 is located underneath the first and second sidewall spacers 24 and 26, while the surface metal silicide layer 16 is located underneath the metal contact 28.

The conventional buried resistor 1 as illustrated by FIG. 1 typically has an end resistance ranging from about 90 ohm-microns or greater.

In order to further reduce the end resistance of conventional buried resistors to less than 90 ohm-microns, the present invention proposes replacement of the wide inner and outer sidewall spacers with a single, narrower sidewall spacer that has a spacer width ranging from about 10 nm to about 30 nm.

Figure 2:
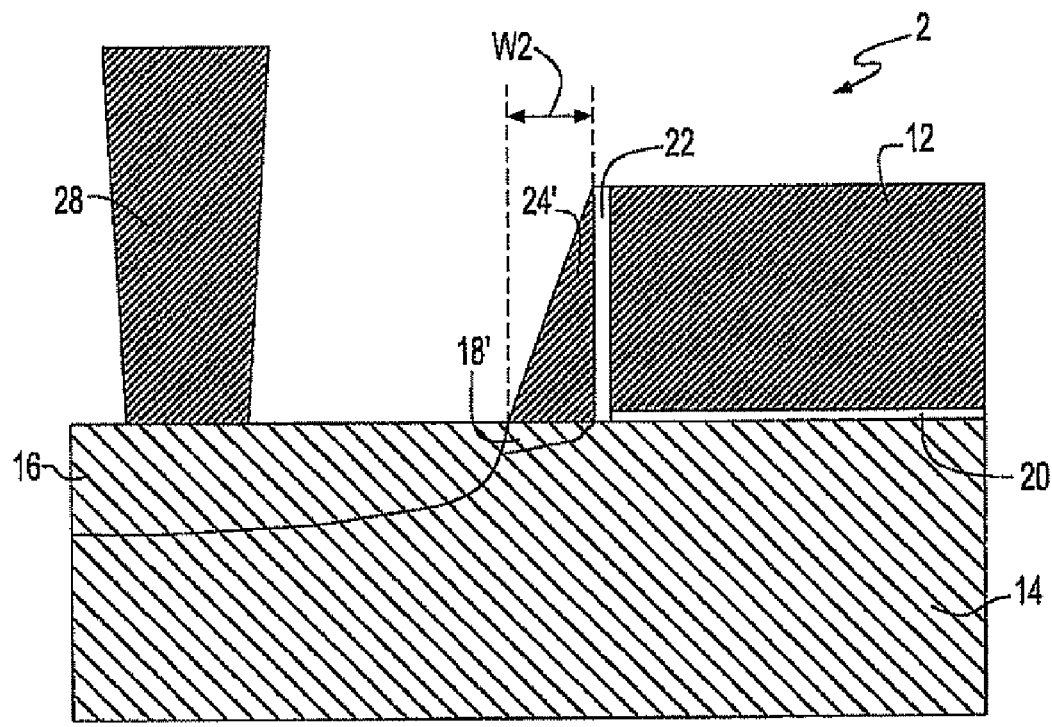
FIG. 2 shows a partial cross-sectional view of a buried resistor containing an inner nitride sidewall spacer, but not the outer oxide sidewall spacer, and having a spacer width (W2) ranging from about 10 nm to about 30 nm, according to one embodiment of the present invention.

FIG. 2 shows an exemplary buried resistor 2 that contains a narrower sidewall spacer, according to one embodiment of the present invention. Specifically, the buried resistor 2 contains essentially the same components as the conventional buried resistor 1, with the exception that the wide inner sidewall spacer 24 and the outer sidewall spacer 26 in the conventional buried resistor 1 have been replaced with a single, narrower sidewall spacer 24' that has a spacer width (W2) ranging from about 10 nm to about 30 nm. The narrower sidewall spacer 24' significantly reduces the contact resistance of the buried resistor 2 by about 36 ohm-microns, in comparison with the conventional buried resistor 1.

As mentioned hereinabove, the contact resistance of buried resistors can further be reduced by blocking the buried resistors from pre-amorphization implantation, which is typically done using germanium, silicon, or xenon implants to amorphize the semiconductor substrate 14 so as to reduce channeling during the subsequent halo and extension implantations. The amorphization damage can result in increased contact resistance in the buried resistors. Therefore, by blocking the buried resistors from the pre-amorphization implantation, the present invention can achieve further reduction in the contact resistance (by at least about 18 ohm-microns) in such buried resistors.

FIGS. 3-12 show the exemplary processing steps for forming an exemplary buried resistor that is incorporated in a CMOS circuit, according to one embodiment of the present invention. The exemplary buried resistor is formed side-by-side with an n-FET and a p-FET on a semiconductor substrate, and it has a narrower sidewall spacer and is essentially free of pre-amorphization implants. For comparison purposes, FIGS. 3-12 also show certain conventional processing steps that are typically used for forming a buried resistor that comprises wide sidewall spacers and pre-amorphization implants.

Note that in these drawings, which are not drawn to scale, like and/or corresponding elements are referred to by like reference numerals. It is further to be noted that in the drawings, only one n-FET, one p-FET, and one buried resistor are shown on a semiconductor substrate. Although illustration is made to such an embodiment, the present invention is not limited to the formation of any specific number of n-FETs, p-FETs, buried resistors, and other passive components.

Figure 3:
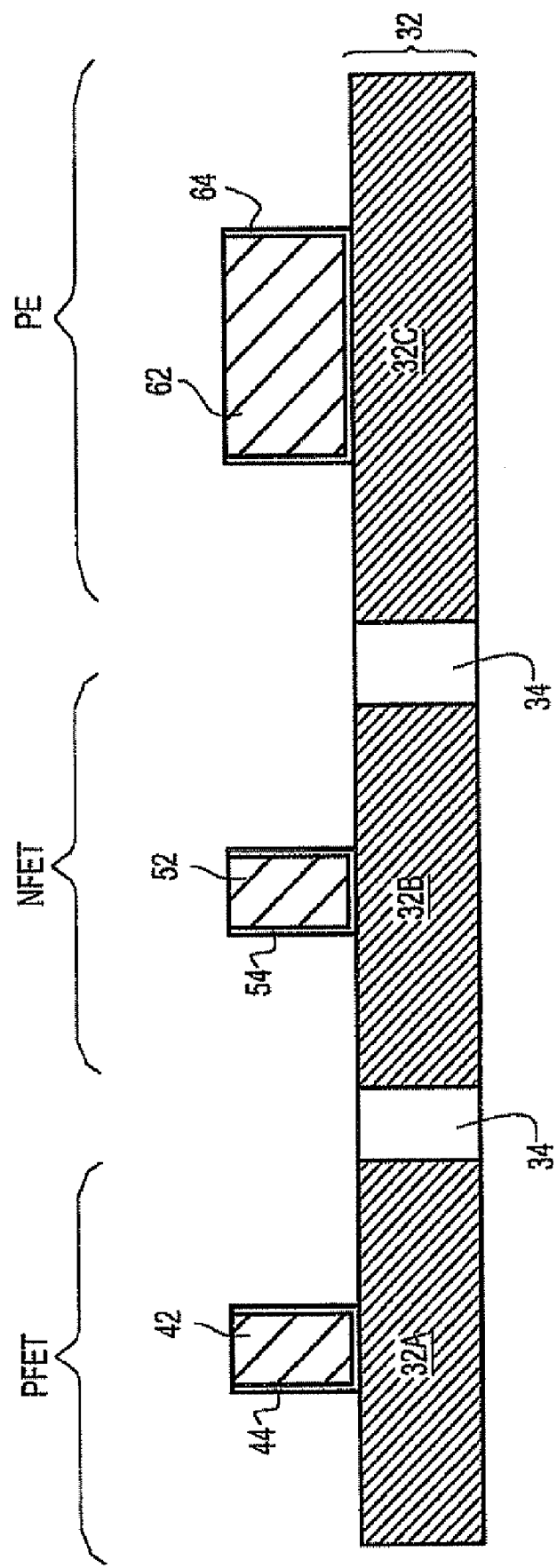

Reference is first made to FIG. 3, which shows a semiconductor substrate 32 that contains at least three device regions that are adjacent to each other and are isolated from each other by shallow trench isolation regions 34. The at least three device regions include, but are not limited to: a p-FET device region 32A doped with a n-type dopant species, an n-FET device region 32B doped with a p-type dopant species, and a passive element (PE) device region 32C also doped with a $N^+$ dopant. The $N^+$ dopant in the PE device region 32C functions to set the sheet resistance of the passive element to be formed thereon.

The semiconductor substrate 32 may comprise any semiconductor material including, but not limited to: Si, SiC, SiGe, SiGeC, Ge alloys, GaAs, InAs, TnP, other III-V or II-VI compound semiconductors, or organic semiconductor structures. In some embodiments of the present invention, it is preferred that the semiconductor substrate 32 be composed of a Si-containing semiconductor material, i.e., a semiconductor material that includes silicon. The semiconductor substrate 32 may comprise a bulk semiconductor structure, a layered semiconductor structure such as Si/SiGe, or a semiconductor-on-insulator structure. Preferably, the semiconductor substrate 32 is a semiconductor-on-insulator (SOI) substrate that contains a semiconductor layer 32, a buried insulator layer (not shown), and a semiconductor base layer (not shown), and the buried insulator layer (not shown) may comprise a crystalline or a non-crystalline oxide or nitride.

Further, the semiconductor substrate 32 may comprise doped, undoped, or contain both doped and undoped device regions therein 32A, 32B, and 32C. The doped device regions are typically known as "wells". Isolation regions 34 are typically formed into the semiconductor substrate 32 to provide isolation between the doped device regions 32A, 32B, and 32C for the n-FET, the p-FET, and the passive element (PE) to be formed thereon. The isolation regions 34 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

A first patterned gate stack, which contains a gate conductor 42 encapsulated by a thin dielectric film 44, is formed over the p-FET device region 32A on the semiconductor substrate 32. A second patterned gate stack, which contains a gate conductor 52 encapsulated by a thin dielectric film 54, is formed over the n-FET device region 32B. A third patterned gate stack, which contains a polysilicon layer 62 encapsulated by a thin dielectric film 64, is formed over the PE device region 32C. The first and second gate stacks define the gate electrodes of an n-FET and a p-FET, while the third gate stack defines the length of the resistive element of a buried resistor in the devise region below. The gate conductors 42 and 52 of the n-FET and the p-FET preferably comprise doped polysilicon, although other conductor materials, such as metals, metal alloys, metal silicides, or metal nitrides, can also be used for forming such gate conductors 42 and 52. The polysilicon layer 62 of the buried resistor need not be doped, since this layer serves only to define the length of the resistive element of the buried resistor and to prevent the formation of the contact silicide on the body of the buried resistor. The upper surface of each of the patterned gate stack is typically exposed, as shown in FIG. 3.

The thin dielectric films 44, 54, and 64 that encapsulate the gate conductors 42 and 52 and the polysilicon layer 62 preferably comprise any suitable dielectric material, including, but not limited to: oxides, nitrides, and oxynitrides. In one embodiment, it is preferred that the thin dielectric films 44, 54, and 64 are comprised of a high dielectric constant oxide material such as, for example, $SiO_2$, $HfO_2$, $ZrO_2$, $Al_2O_3$, $TiO_2$, $La_2O_3$, $SrTiO_3$, $LaAlO_3$, and mixtures thereof.

The thin dielectric films 44, 54, and 64 each incorporates: (1) a gate dielectric layer located between the respective gate conductor (or polysilicon layer for the buried resistor) and the underlying semiconductor substrate 32, and (2) an offset spacer formed along the sidewall of the respective gate conductor (or polysilicon layer for the buried resistor). The gate dielectric layers can be formed by a thermal growing process such as, for example, oxidation, nitridation or oxynitridation. Alternatively, the gate dielectric layers can be formed by a deposition process such as, for example, chemical vapor deposition (CVD), plasma-assisted CVD, atomic layer deposition (ALD), evaporation, reactive sputtering, chemical solution deposition and other like deposition processes. The offset spacers can be readily formed by one or more well known processing steps, such as gate sidewall oxidation, and offset spacer deposition and etching.

The physical thickness of the thin dielectric films 44, 54, and 64 may vary, but typically, they each have a thickness from about 0.5 to about 10 mm, with a thickness from about 0.5 to about 3 nm being more typical.

Next, a blanket pre-amorphization implantation (PAI) step (indicated by the arrowheads in FIGS. 4A and 4B) is carried out next over the entire structure. The PAI step typically introduces germanium, silicon, or xenon implants (not shown) to amorphize the semiconductor substrate 32 to reduce channeling of the subsequently formed halo and extension implants (not shown). Preferably, but not necessarily, the blanket PAI step is carried out at an energy level of about 15 KeV and a dosage concentration from about $1\times10^{13}/cm^2$ to about $1\times10^{16}/cm^2$, and more preferably at a dosage concentration of about $3\times10^{14}/cm^2$.

In a conventional process, the p-FET device region 32A, the n-FET device region 32B, and the PE device region 32C are all exposed to the PAI step, as shown in FIG. 4A. As a result, the p-FET device region 32A, the n-FET device region 32B, and the PE device region 32C as formed by the conventional process all contain pre-amorphization implants such as germanium, silicon, or xenon (not shown), typically at a dosage concentration ranging from about $1\times10^{13}/cm^2$ to about $1\times10^{16}/cm^2$, and more preferably about $3\times10^{14}/cm^2$. However, in the process of the present invention, the PE device region 32C is protected by a patterned mask 70 during the blanket PAI step, as shown in FIG. 4B. Correspondingly, the PE device region 32C as formed by the present invention is essentially free of pre-amorphization implants.

Figure 5:
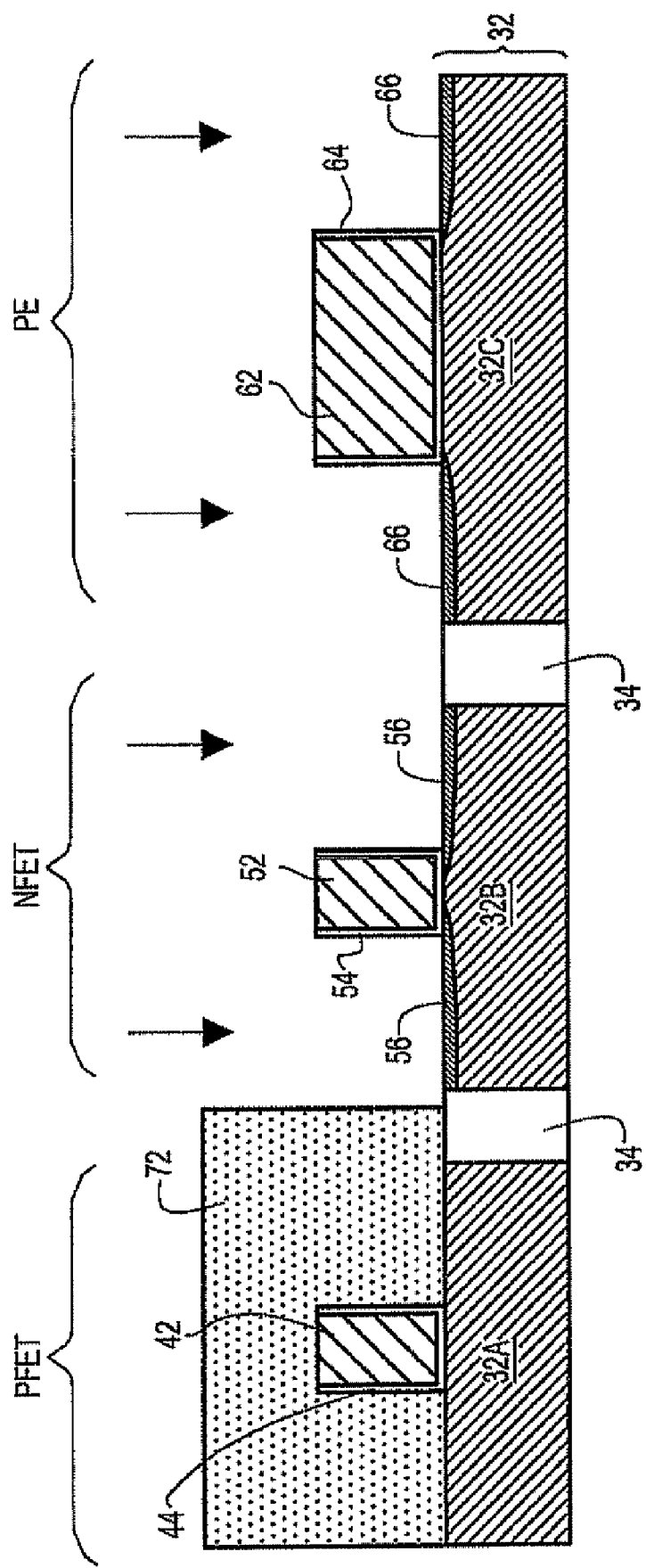

Next, the patterned mask 70 is removed from the PE device region 32C, and a new patterned mask 72 is formed over the p-FET device region 32A, as shown in FIG. 5. The new patterned mask 72 is used in an extension implantation step to form extension implants 56 and 66 in the n-FET device region 32B and the PE device region 32C. Preferably, the extension implants 56 and 66 comprises one or more n-type dopant species selected from the group consisting of arsenic, phosphorus, antimony, etc., and they are introduced at an energy level of about 2 KeV and a dosage concentration from about $1 \times 10^{14}/cm^2$ to about $1 \times 10^{16}/cm^2$, and more preferably at a dosage concentration of about $3 \times 10^{15}/cm^2$. Further, an optional halo implantation step can be carried out to form halo implants (not shown) in the n-FET device region 32B and the PE device region 32C. The halo implants (not shown) preferably comprise one or more p-type dopant species selected from the group consisting of boron, aluminum, gallium, and indium, and they can be introduced at an energy level of about 10 KeV and a dosage concentration from about $1 \times 10^{12}/cm^2$ to about $1 \times 10^{15}/cm^2$, and more preferably at a dosage concentration of about $8 \times 10^{13}/cm^2$.

Figure 6:
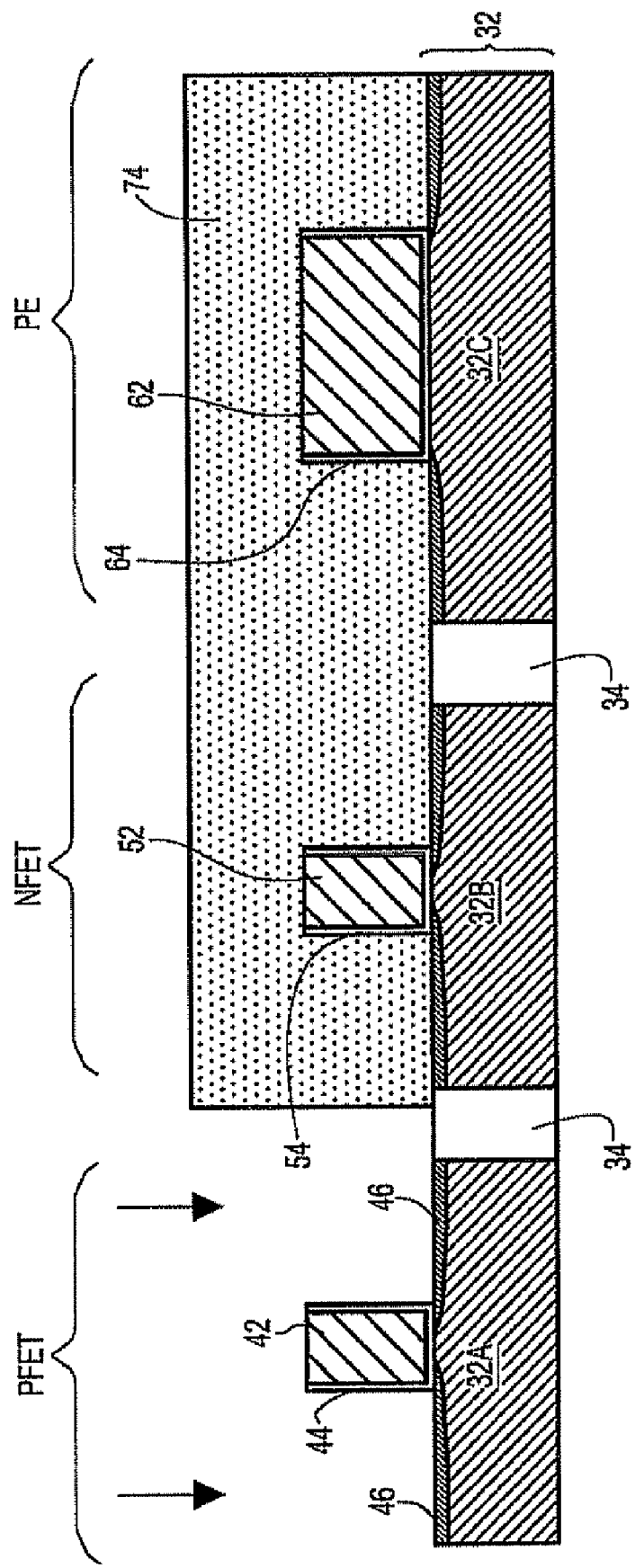

Subsequently, the patterned mask 72 is removed from the p-FET device region 32A, and another patterned mask 74 is formed over the n-FET device region 32B and the PE device region 32C, as shown in FIG. 6. The patterned mask 74 is used in another extension implantation step to form extension implants 46 in the p-FET device region 32A. Further, an optional halo implantation step can be carried out to form halo implants (not shown) in the p-FET device region 32A.

It is important to note that the processing steps illustrated by FIGS. 5 and 6 can be carried out in any order, i.e., either with the n-FET/PE extension/halo implants 56 and 66 formed before the p-FET extension/halo implants 46, or with the p-FET extension/halo implants 46 formed before the n-FET/PE extension/halo implants 56 and 66.

After the extension/halo implantation, a first insulating layer 76 and a second insulating layer 78 having a different composition than the first insulating layer 76 are formed over the entire structure, as shown in FIG. 7. The first and second insulating layers 76 and 78 may comprise any suitable insulator material, including, but not limited to: oxides, nitrides, and oxynitrides. Preferably, but not necessarily, the first insulating layer 76 comprises a nitride, and the second insulating layer 78 comprises an oxide.

The second insulating layer 78 is then patterned to form outer sidewall spacers 47, 57, and 67 for the p-FET, the n-FET, and the buried resistor. Preferably, the second insulating layer 78 is patterned by a directional dry etching step, which etches away portions of the second insulating layer 78. Suitable dry etching processes that can be used in the present invention in forming the outer sidewall spacers 47, 57, and 67 include, but are not limited to: reactive ion etching (RIE), ion beam etching, plasma etching or laser ablation.

In the conventional process, the p-FET device region 32A and the PE device region 32C are then covered by patterned masks 80, followed by an etching step to selectively remove the outer sidewall spacer 57 from the n-FET, as shown in FIG. 9A. As a result, the p-FET and the buried resistor contain outer sidewall spacers, but the n-FET does not. However, in the process of the present invention, only the p-FET device region 32A is covered by the patterned mask 80 during the etching step, which selectively removes the outer sidewall spacers 57 and 67 from both the n-FET and the buried resistor, as shown in FIG. 9B. Consequentially, the p-FET contains an outer sidewall spacer, but the n-FET and the buried resistor do not.

After the etching step, the mask(s) 80 is removed from the respective elements, and an additional dry etching step is carried out to pattern the first insulating layer 76. Any suitable dry etching process can be used in the present invention to pattern the first insulating layer 76, which includes, but is not limited to: reactive ion etching (RIE), ion beam etching, plasma etching or laser ablation. Preferably, RIE is used for patterning the first insulating layer 76.

In the conventional process, the first insulating layer 76 located over the p-FET device region 32A and the PE device region 32C is partially protected by the outer sidewall spacers 47 and 67 during the additional dry etching step, so that wider inner sidewall spacers 48 and 68 are formed for the p-FET and the buried resistor, but a narrower sidewall spacer 58 is formed for the n-FET, as shown in FIG. 10A. However, in the process of the present invention, the first insulating layer 76 is only partially protected by the outer sidewall spacer 47 in the p-FET device region 32A during the additional dry etching step. As a result, a wider inner sidewall spacer 48 is formed for the p-FET, while narrower sidewall spacers 58 and 68' are formed for the n-FET and the buried resistor, as shown in FIG. 10B.

Another blanket PAI step can be carried out over the entire structure to introduce an additional pre-amorphization implant. As described hereinabove, the buried resistor is expose to the PAI in the conventional process as shown in FIG. 11A, but it is protected against the PAI by a patterned mask 82 in the process of the present invention as shown in FIG. 11B.

Thereafter, well-known CMOS processing steps can be carried out to form: (1) source and drain regions 41 and 51 for the p-FET and the n-FET, (2) source/drain metal silicide layers 43, 53, and 63 for the p-FET, the n-FET, and the buried resistor, and (3) metal contacts 45, 55, and 65 for the p-FET, the n-FET, and the buried resistor, as shown in FIGS. 12A and 12B. The processes for fabricating these components are known in the art and are therefore not described herein in detail.

The buried resistor formed according to the present invention as described hereinabove has significantly reduced contact resistance in comparison with the conventional buried resistor. More importantly, the buried resistor of the present invention can be readily integrated into the standard CMOS fabrication process with no or few additional processing steps.

Although the above description is provided primarily in terms of buried resistors, for simplicity and illustration purposes only, the present invention is not limited to buried resistors, but is broadly applicable to other passive elements typically used for forming analog circuitry in CMOS devices, such as capacitors, diodes, inductors, attenuators, power dividers, and antennas, etc., with or without modifications and variations, as readily determinable by a person ordinarily skilled in the art according to the principles described herein. Various passive elements as mentioned hereinabove can be readily prepared using conventional CMOS processing techniques that are well known to those skilled in the art, and therefore details concerning their fabrication are not provided herein.

While FIGS. 1-12 illustratively demonstrate exemplary passive elements and exemplary processing steps for manufacturing same, according to specific embodiments of the present invention, it is clear that a person ordinarily skilled in the art can readily modify the structures and processing steps illustrated herein, for adaptation to specific application requirements, consistent with the above descriptions. It should therefore be recognized that the present invention is not limited to the specific embodiments illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a complementary metal-oxide semiconductor (CMOS) circuit, comprising forming at least one n-type field effect transistor (n-FET), at least one p-type field effect transistor (p-FET), and at least one passive element on adjacent but isolated device regions of a semiconductor substrate, wherein the at least one passive element has an end resistance of less than 90 ohm-microns.

2. The method of claim 1, wherein the at least one n-FET, the at least one p-FET, and the at least one passive element each comprise one or more sidewall spacers, wherein the at least one n-FET and the at least one passive element both have a spacer width ranging from about 10 nm to about 30 nm, and wherein the at least one p-FET has a spacer width ranging from about 40 nm to about 80 nm.

3. The method of claim 2, wherein the one or more sidewall spacers of the at least one n-FET, the at least one p-FET, and the at least one passive element are formed by:
    forming a first insulating layer over the at least one n-FET, the at least one p-FET, and the at least one passive element;
    forming a second insulating layer over the first insulating layer, wherein the first and second insulating layer comprises different insulator materials;
    patterning the second insulating layer to form outer sidewall spacers for the at least one n-FET, the at least one p-FET, and the at least one passive element;
    forming a patterned mask to selectively protect the at least one p-FET and expose the at least one n-FET and the at least one passive element;
    selectively removing the outer sidewall spacers of the at least one n-FET and the at least one passive element, wherein the outer sidewall spacer of the at least one p-FET is protected by the patterned mask;
    removing the patterned mask; and
    patterning the first insulating layer to form additional sidewall spacers for the at least one n-FET, the at least one p-FET, and the at least one passive element, wherein the at least one p-FET, being partially protected by the outer sidewall spacer, has an inner sidewall spacer with a spacer width ranging from about 40 nm to about 80 nm, and wherein the at least one n-FET and the at least one passive element, not protected by any outer sidewall spacer, each has a sidewall spacer with a spacer width ranging from about 10 nm to about 30 nm.

4. The method of claim 1, wherein the at least one passive element is essentially free of pre-amorphization implants, and wherein the at least one n-FET and the at least one p-FET both comprise pre-amorphization implants at a dosage concentration ranging from about $1 \times 10^{13}/cm^2$ to about $1 \times 10^{16}/cm^2$.

5. The method of claim 4, wherein the pre-amorphization implants are formed in the at least one n-FET and the at least one p-FET by at least one pre-amorphization implantation step, during which a patterned mask selectively protects the at least one passive element.

6. The method of claim 1, wherein the at least one passive element comprises one or more sidewall spacers and is characterized by a spacer width ranging from about 10 nm to about 30 nm, and wherein the at least one passive element is essentially free of pre-amorphization implants.

7. The method of claim 1, comprising an extension implantation step during which extension implants are formed in the at least one passive element at a dosage concentration from about $1 \times 10^{14}/cm^2$ to about $1 \times 10^{16}/cm^2$, wherein the extension implants are selected from the group consisting of arsenic, phosphorus, and antimony.

8. The method of claim 7, further comprising a halo implantation step during which halo dopant implants are formed in the at least one passive element at a dosage concentration from about $1 \times 10^{12}/cm^2$ to about $1 \times 10^{15}/cm^2$, wherein the halo implants are selected from the group consisting of boron, aluminum, gallium, and indium.

9. The method of claim 1, wherein the at least one passive element is selected from the group consisting of buried resistors, capacitors, diodes, inductors, attenuators, power dividers, and antennas.

10. The method of claim 1, wherein the at least one passive element is a buried resistor that comprises a silicon resistive element.

* * * * *